(12) United States Patent
Lee et al.

(10) Patent No.: US 12,513,818 B2
(45) Date of Patent: Dec. 30, 2025

(54) FLEXIBLE CIRCUIT BOARD AND ELECTRONIC DEVICE COMPRISING SAME

(71) Applicant: Samsung Electronics Co., Ltd., Suwon-si (KR)

(72) Inventors: Youngsun Lee, Suwon-si (KR); Kideok Kim, Suwon-si (KR); Byeongkeol Kim, Suwon-si (KR); Jongbum Lee, Suwon-si (KR); Jongmin Jeon, Suwon-si (KR); Jeongbeom Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 169 days.

(21) Appl. No.: 18/348,622

(22) Filed: Jul. 7, 2023

(65) Prior Publication Data

US 2023/0354511 A1    Nov. 2, 2023

Related U.S. Application Data

(63) Continuation of application No. PCT/KR2021/020156, filed on Dec. 29, 2021.

(30) Foreign Application Priority Data

Jan. 13, 2021 (KR) .................. 10-2021-0004784

(51) Int. Cl.
*H05K 1/02* (2006.01)
*H05K 1/14* (2006.01)
*H05K 3/28* (2006.01)

(52) U.S. Cl.
CPC ........... *H05K 1/0281* (2013.01); *H05K 1/147* (2013.01); *H05K 3/28* (2013.01); *H05K 2201/10378* (2013.01)

(58) Field of Classification Search
CPC ........ H05K 1/0281; H05K 1/147; H05K 3/28; H05K 2201/10378
(Continued)

(56) References Cited

U.S. PATENT DOCUMENTS 11,169,629 B2   11/2021 Baek et al.
11,217,850 B2   1/2022 Lee et al.
(Continued)

FOREIGN PATENT DOCUMENTS

JP    2002-232088 A    8/2002
JP    2010-073669 A    4/2010
(Continued)

OTHER PUBLICATIONS

International Search Report with Written Opinion and English translation dated Apr. 22, 2022; International Appln. No. PCT/KR2021/020156.
(Continued)

*Primary Examiner* — Andargie M Aychillhum
(74) *Attorney, Agent, or Firm* — Jefferson IP Law, LLP

(57) ABSTRACT

An electronic device is provided. The electronic device includes a housing, a main circuit board arranged inside the housing, and at least one flexible circuit board electrically connected to the main circuit board, wherein the flexible circuit board includes a flexible circuit part, and a joining part arranged on one end of the flexible circuit part and connected to the main circuit board. A first joining part includes a first layer oriented a first direction and having at least one first connection hole, a second layer oriented in a second direction opposite to the first direction and has at
(Continued)

least one second connection hole, and a reinforcement member which is arranged between the first and the second layer and is connected to the flexible circuit part while being arranged such that at least a portion thereof overlaps with the one end part of the flexible circuit part.

20 Claims, 16 Drawing Sheets

(58) Field of Classification Search
USPC .......................................................... 361/749
See application file for complete search history.

(56) References Cited

U.S. PATENT DOCUMENTS

| | | | |
|---|---|---|---|
| 11,259,407 B2 | 2/2022 | Shim et al. | |
| 2007/0230132 A1* | 10/2007 | Lee | H05K 7/20963 |
| | | | 361/707 |
| 2010/0073887 A1* | 3/2010 | Takeguchi | G06F 1/1616 |
| | | | 174/254 |
| 2013/0248950 A1* | 9/2013 | Kang | H10D 84/038 |
| | | | 257/288 |
| 2019/0296464 A1 | 9/2019 | Taschner et al. | |
| 2019/0317566 A1* | 10/2019 | Schnell | G06F 1/185 |
| 2020/0375026 A1* | 11/2020 | Shim | H04M 1/0277 |

FOREIGN PATENT DOCUMENTS

| | | | |
|---|---|---|---|
| JP | 2013-239565 A | 11/2013 | |
| JP | 2014-82325 A | 5/2014 | |
| JP | 5556424 B2 | 7/2014 | |
| JP | 5782013 B2 | 9/2015 | |
| JP | 6083130 B2 | 2/2017 | |
| KR | 10-2010-0024200 A | 3/2010 | |
| KR | 10-2010-0095742 A | 9/2010 | |
| KR | 10-1726577 B1 | 4/2017 | |
| KR | 10-2097193 B1 | 4/2020 | |
| KR | 10-2020-0134068 A | 12/2020 | |
| WO | 2019/119768 A1 | 6/2019 | |

OTHER PUBLICATIONS

Extended European Search Report dated Jun. 19, 2024; European Appln. No. 21919947.8-1211.
Korean Office Action with English translation dated May 30, 2025; Korean Appln. No. 10-2021-0004784.

* cited by examiner

FLEXIBLE CIRCUIT BOARD AND ELECTRONIC DEVICE COMPRISING SAME

CROSS-REFERENCE TO RELATED APPLICATION(S)

This application is a continuation application, claiming priority under § 365(c), of an International application No. PCT/KR2021/020156, filed on Dec. 29, 2021, which is based on and claims the benefit of a Korean patent application number 10-2021-0004784, filed on Jan. 13, 2021, in the Korean Intellectual Property Office, the disclosure of which is incorporated by reference herein in its entirety.

BACKGROUND

1. Field

The disclosure relates to a rigidity reinforcing structure of a connection part of a flexible circuit board (FPCB) included in an electronic device.

2. Description of Related Art

An electronic device may include at least one circuit board and multiple components disposed therein. The multiple components may be disposed on the circuit board. Components not disposed on the circuit board and the components disposed on the circuit board may transmit/receive signals by using a flexible circuit board.

The flexible circuit board may include opposite ends, and connection parts may be disposed at the opposite ends, respectively. A connection part at one end of the flexible circuit board may be connected to a component, and a connection part at the other end may be connected to a main circuit board to make it possible for signals to be transmitted/received between the component and the main circuit board.

The connection part of the flexible circuit board and the main circuit board may be bonded to each other by using a hot-bar method. The hot-bar method is a bonding method using wettability of lead through a plated through hole (PHT) in the connection part, and may provide a structure in which molten lead is bonded to a solder pad of the main circuit board through the PHT.

The above information is presented as background information only to assist with an understanding of the disclosure. No determination has been made, and no assertion is made, as to whether any of the above might be applicable as prior art with regard to the disclosure.

SUMMARY

In an electronic device, since the connection structure between the connection part of the flexible circuit board and the main circuit board using the hot-bar method has a two-dimensional connection structure, damage to the connection structure may occur due to lack of rigidity of the connection structure.

For example, in the connection structure between the connection part of the flexible circuit board and the main circuit board using the hot-bar method, bending may occur at the boundary between the flexible circuit and the connection part. Due to this bending, cracks or tearing may occur at the boundary.

Aspects of the disclosure are to address at least the above-mentioned problems and/or disadvantages and to provide at least the advantages described below. Accordingly, an aspect of the disclosure is to provide a flexible circuit board capable of preventing cracks or tearing at a boundary portion by adding a structure for reinforcing rigidity between a flexible circuit part and a connection part of the flexible circuit board, and an electronic device including the flexible circuit board.

Another aspect of the disclosure is to provide a flexible circuit board capable of preventing cracks or tearing at a boundary portion by adding a structure for reinforcing rigidity between a flexible circuit part and a connection part of the flexible circuit board, and an electronic device including the flexible circuit board.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a main circuit board disposed within the housing, and at least one flexible circuit board electrically connected to the main circuit board. The flexible circuit board includes a flexible circuit part, and a connection part disposed at one end of the flexible circuit part and connected to the main circuit board. The connection part includes a first layer oriented in a first direction and including one or more first connection holes, a second layer oriented in a second direction opposite to the first direction and including one or more second connection holes, and a reinforcing member disposed between the first and second layers and connected to the flexible circuit part in a state of at least partially overlapping one end portion of the flexible circuit part.

In accordance with another aspect of the disclosure, a flexible circuit board is provided. The flexible circuit board includes a flexible circuit part, and a connection part disposed at one end of the flexible circuit part. The connection part includes a first layer oriented in a first direction and including one or more first connection holes, a second layer oriented in a second direction opposite to the first direction and including one or more second connection holes, and a reinforcing member disposed between the first and second layers and connected to the flexible circuit part in a state of at least partially overlapping one end portion of the flexible circuit part.

According to various embodiments of the disclosure, it is possible to prevent a flexible circuit board from being cracked or torn at a boundary portion between a flexible circuit part and a connection portion.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
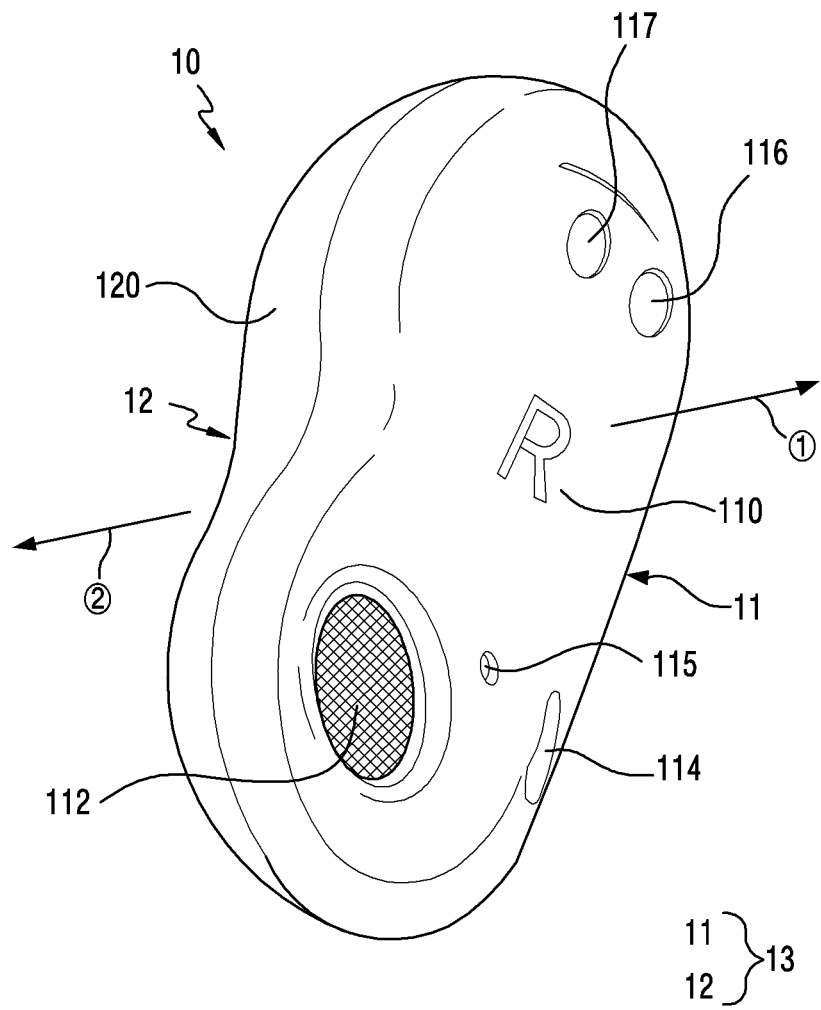
FIGS. 1 and 2 are perspective views each illustrating an appearance of a wearable device according to various embodiments of the disclosure.
Figure 2:
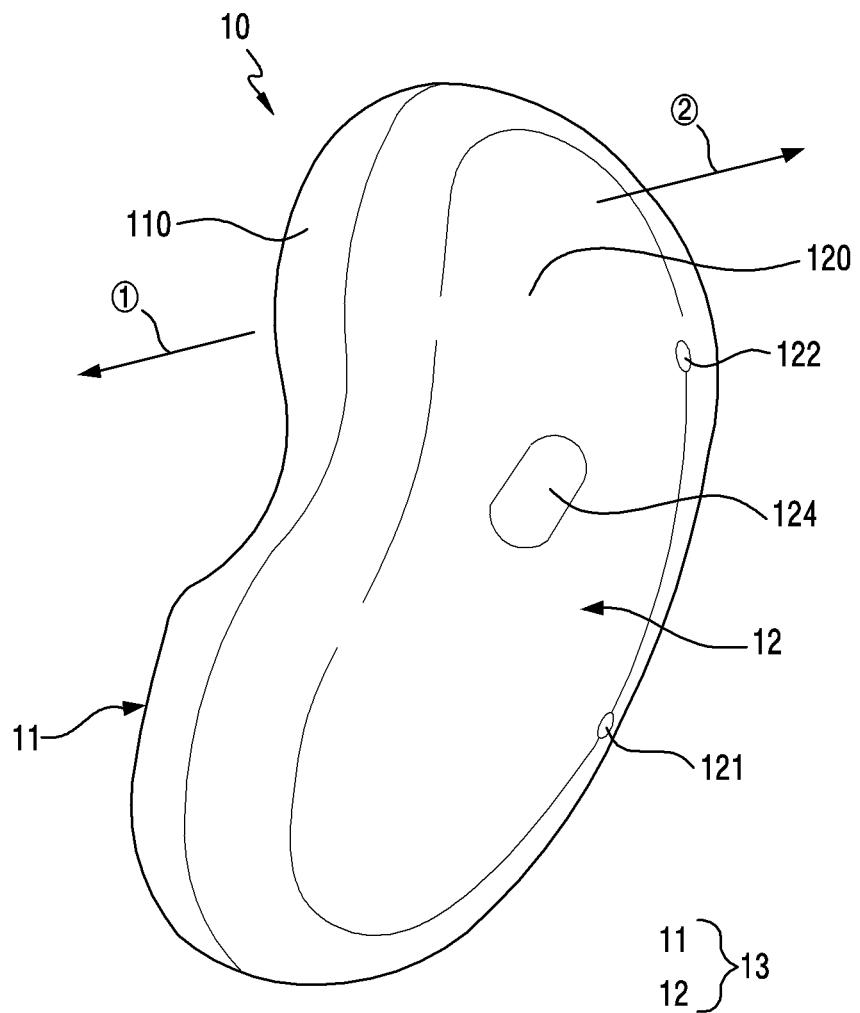
Figure 3:
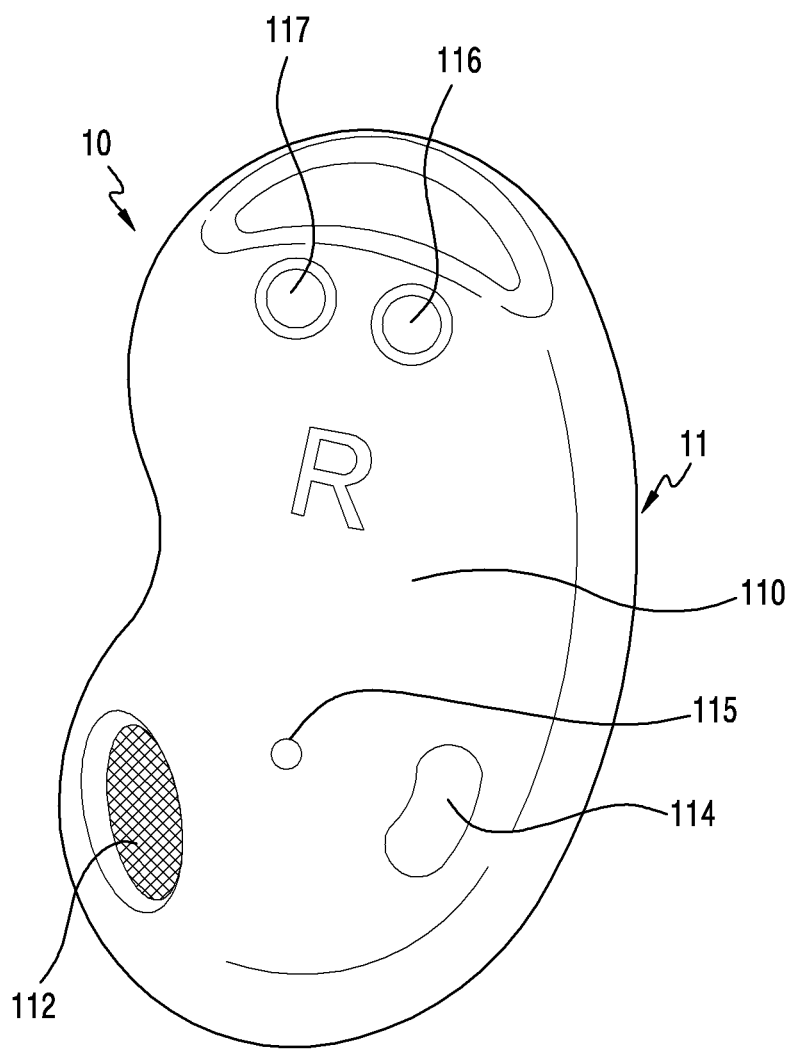
FIG. 3 is a plan view illustrating the wearable device according to an embodiment of the disclosure.

FIGS. 1 and 2 are perspective views each illustrating an appearance of a wearable device according to various embodiments of the disclosure. FIG. 3 is a plan view illustrating the wearable device according to an embodiment of the disclosure.

Referring to FIGS. 1 to 3, a wearable device 10 according to an embodiment may be an ear-wearable electronic device. According to an embodiment, the wearable device 10 may be a device that is wearable in an external ear of a user's ear. For example, the wearable device 10 is a wearable device to be worn in the right ear and may have a first surface 110 on which the letter "R" indicating that the wearable device is to be worn in a right ear may be marked.

According to an embodiment, the wearable device 10 may include a housing 13 in which multiple components are mounted. According to an embodiment, the housing 13 may include a first housing 11 including the first surface 110 oriented in a first direction ① and a second housing 12 including a second surface 120 oriented in a second direction ②. The first direction ① and the second direction ② may be opposite to each other. For example, each of the first and second surfaces 110 and 120 may partially include a curved surface.

According to an embodiment, the first surface 110 of the first housing 11 may include a speaker nozzle 112, a first port 114, and one or more charging terminals 116 and 117. For example, the first port 114 may include a leakage port. According to an embodiment, the speaker nozzle 112 and the first port 114 may be visually exposed to the outside when looking at the first surface 110.

According to an embodiment, the speaker nozzle 112 may be located in an area of the first surface 110 such that sound output from a speaker disposed inside the housing passes through at least one opening provided in the housing and is output to the outside of the wearable device 10. For example, the speaker nozzle 112 has multiple openings and may be made of at least one of a metal material, a polymer material, and a ceramic material. As another example, the speaker nozzle 112 may include at least one opening and a foreign matter prevention member that blocks the inflow of foreign matter (e.g., dust or moisture).

According to an embodiment, the charging terminals 116 and 117 may be disposed as a pair, and may have contact surfaces exposed to the first surface 110.

According to an embodiment, the wearable device 10 may include a sensor (e.g., a proximity sensor or a biometric sensor) configured to determine whether the wearable device is worn by a user. Referring to FIG. 1, the first housing 11 may be provided with a sensor window 115 that allows the sensor (e.g., a proximity sensor or a biometric sensor) to determine whether the wearable display is worn by a user. According to an embodiment, the sensor window 115 may be located between the speaker nozzle 112 and the first port 114.

According to an embodiment, the second surface 120 of the second housing 12 may include one or more microphone holes 121 and 122 and a second port 124. According to an embodiment, the second port 124 is a port related to speaker output and used for tuning a low-pass characteristic of the speaker and may be used for a speaker back volume space oriented in the second direction ②.

Figure 4A:
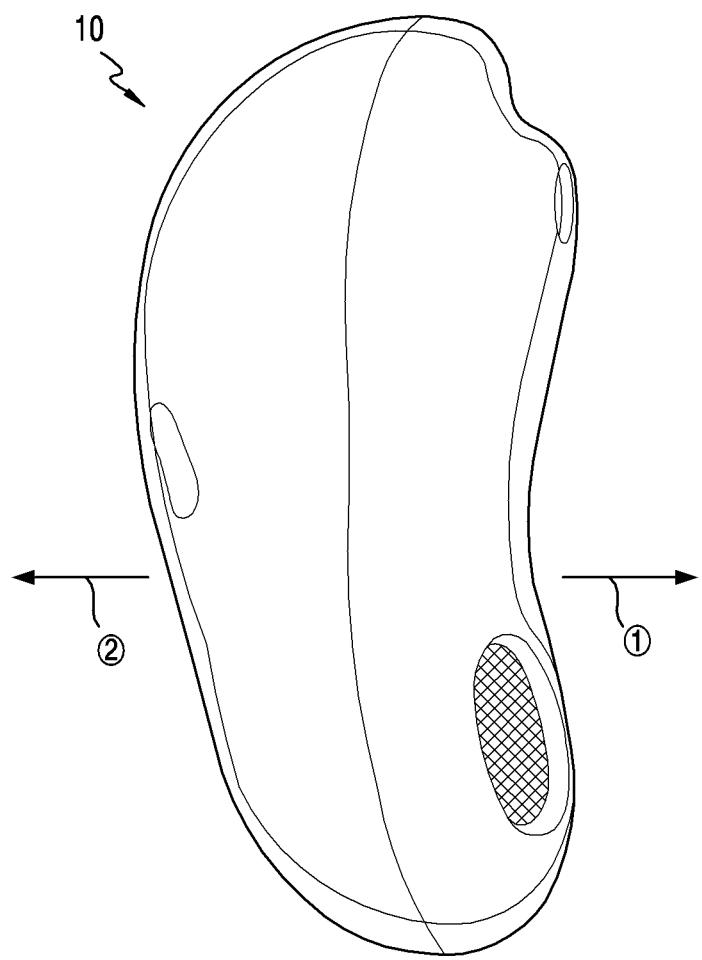
FIG. 4A is a side view illustrating a wearable device to be worn in a right ear according to an embodiment of the disclosure.
Figure 4B:
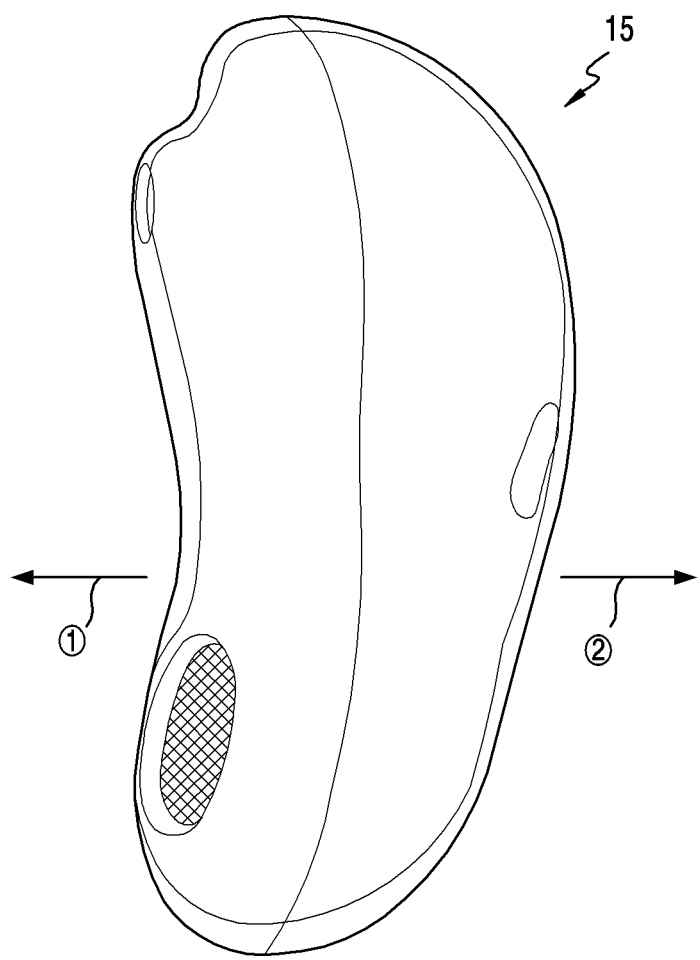
FIG. 4B is a side view illustrating a wearable device to be worn in a left ear according to an embodiment of the disclosure.

FIG. 4A is a side view illustrating a wearable device 10 to be worn in a right ear according to an embodiment of the disclosure. FIG. 4B is a side view illustrating a wearable device 15 to be worn in a left ear according to an embodiment of the disclosure.

Referring to FIGS. 4A and 4B, a pair of ear-wearable devices may include a wearable device 15 to be worn in the left ear and a wearable device 10 to be worn in the right ear.

According to various embodiments, wearable devices may include a head-mounted display (HMD) device such as augmented reality (AR) glasses or a virtual reality (VR) device. For example, the HMD device may include a wearable device that is wearable in a user's ear, such as the wearable device illustrated in FIGS. 1 to 3, 4A, and 4B (e.g., the wearable device 10 or the wearable device 15).

Figure 5:
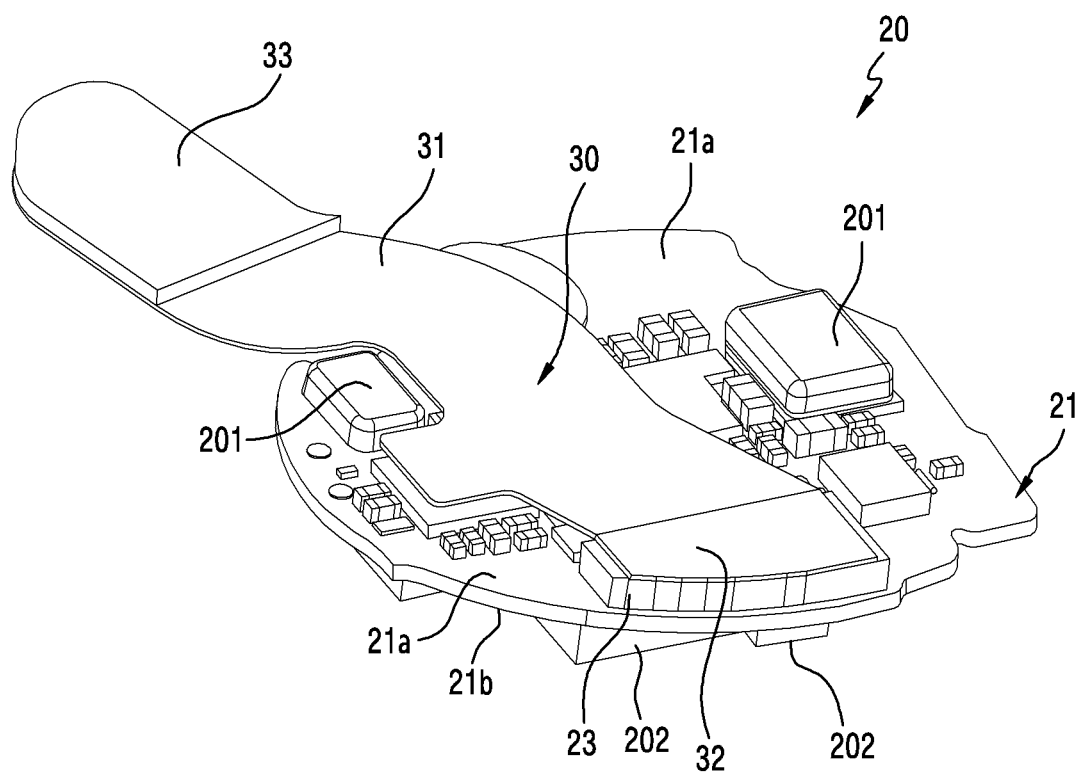
FIG. 5 is a perspective view illustrating a printed circuit board assembly according to an embodiment of the disclosure.
Figure 6:
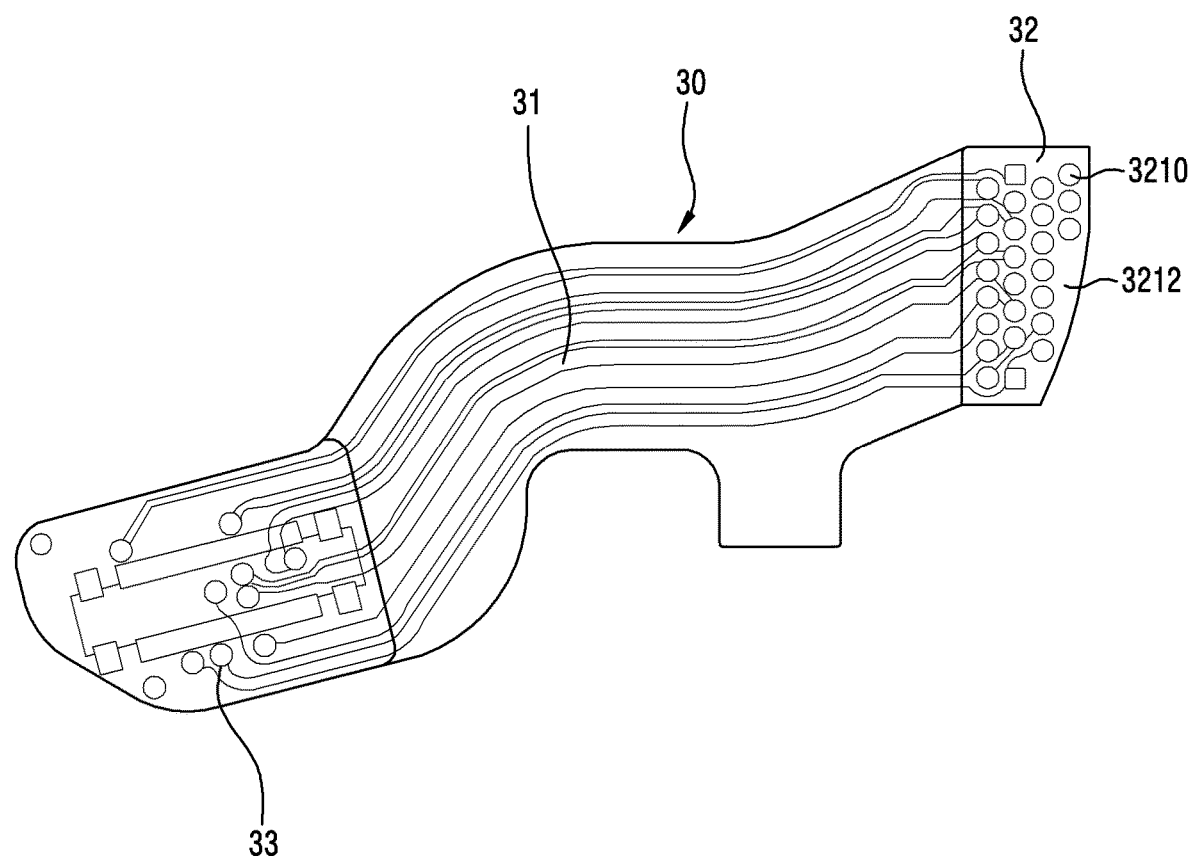
FIG. 6 is a plan view illustrating a flexible circuit board according to an embodiment of the disclosure.

FIG. 5 is a perspective view illustrating a printed circuit board assembly according to an embodiment of the disclosure. FIG. 6 is a plan view illustrating a flexible circuit board according to an embodiment of the disclosure.

Referring to FIGS. 5 and 6, a printed circuit assembly 20 disposed within a housing (e.g., the housing 13 illustrated in FIG. 1) of an electronic device (e.g., the wearable device 10 illustrated in FIG. 1) according to an embodiment may include a main circuit board 21, a flexible circuit board 30, and multiple electronic components 201 and 202. According to an embodiment, the main circuit board 21 may include a first surface 21a oriented in a first direction and a second surface 21b oriented in a second direction opposite to the first direction. According to an embodiment, one end of a flexible circuit board 30 may be connected to the first surface 21a of the main circuit board 21. According to an embodiment, multiple first electronic components 201 may be disposed on the first surface 21a of the main circuit board 21, and multiple second electronic components 202 may be disposed on the second surface 21b.

According to an embodiment, the flexible printed circuit board (FPCB) of the flexible circuit board 30 may include a flexible circuit part 31, a first connection part 32, and a second connection part 33. According to an embodiment, the flexible circuit part 31 may have one end portion on which the first connection part 32 is disposed and the other end portion on which the second connection part 33 is disposed. According to an embodiment, the flexible circuit part 31 may be a conductive connection member that enables signal transmission and reception between the electronic components 201 and 202 and the main circuit board 21 through the connection of the first and second connection parts 32 and 33.

According to an embodiment, the flexible circuit part 31 may exist in one of a foldable state, a curved state, or a bendable state. According to an embodiment, the first connection part 32 may be connected to the first surface 21a of the main circuit board 21, and the second connection part 33 may be connected to the electronic components or the second surface 21b.

According to an embodiment, an interposer 23 may be further disposed on the flexible circuit board 30 for connection with the main circuit board 21. For example, the interposer 23 may be a conductive connection member for connection between the flexible circuit board 30 and the main circuit board 21. According to an embodiment, the interposer 23 may be disposed between the first connection part 32 and the main circuit board 21 so that stress applied to the boundary area between the first connection part 32 and the flexible circuit part 31 can be reduced.

According to an embodiment, the first connection part 32 of the flexible circuit board 30 may include multiple first connection pads 3210 for connection with the main circuit board 21 and an insulating structure 3212 configured to insulate the first connection pads 3210 from each other.

Figure 7A:
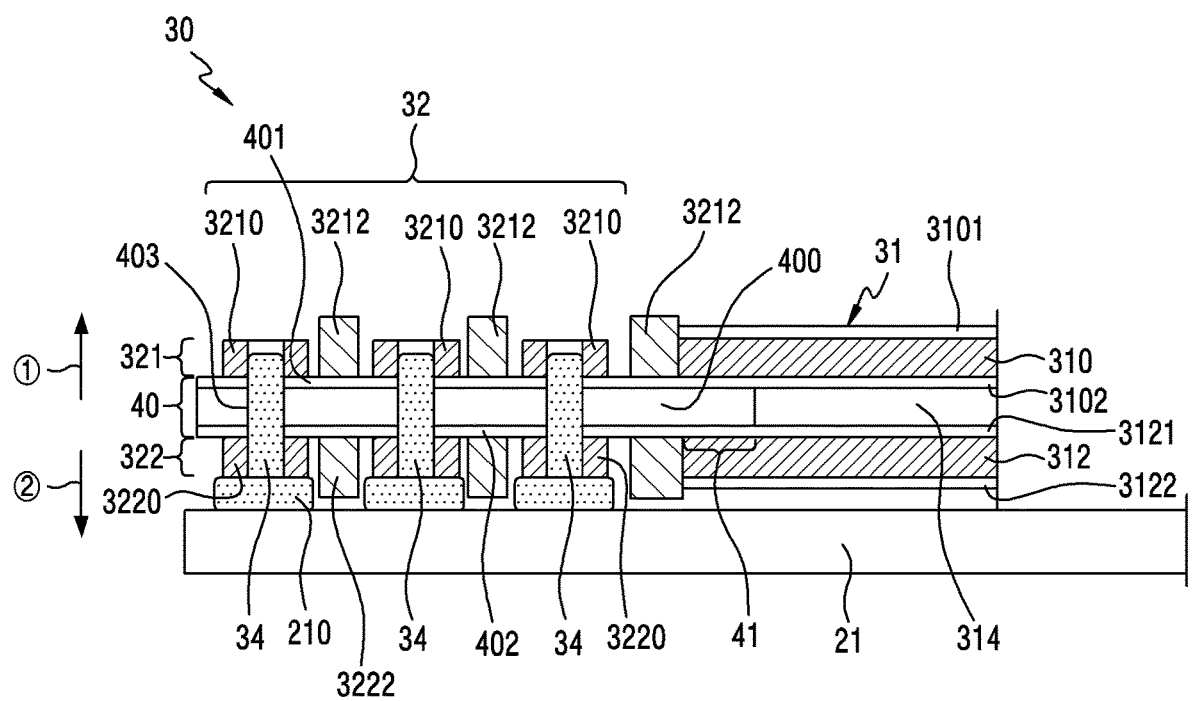
FIG. 7A is a cross-sectional view illustrating a connection structure of a connection part of a flexible circuit board including a reinforcing member according to an embodiment of the disclosure.
Figure 7B:
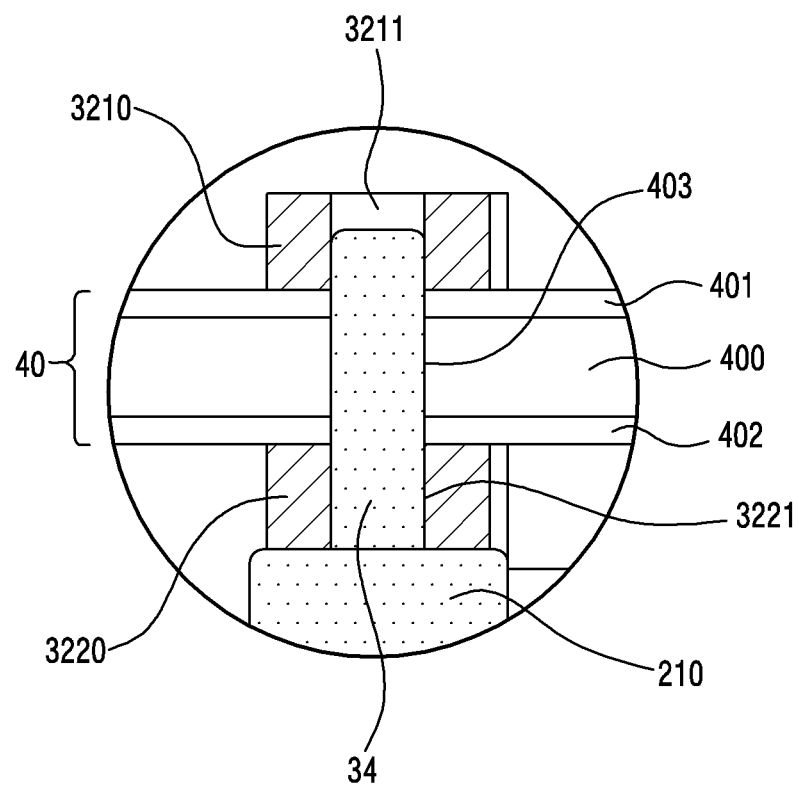
FIG. 7B is an enlarged view of a portion of FIG. 7A according to an embodiment of the disclosure.

FIG. 7A is a cross-sectional view illustrating a connection structure of a connection part of a flexible circuit board including a reinforcing member according to an embodiment of the disclosure. FIG. 7B is an enlarged view of a portion of FIG. 7A according to an embodiment of the disclosure.

Referring to FIGS. 7A and 7B, according to an embodiment, the flexible circuit part 31 of the flexible circuit board 30 may include one or more conductive layers. For example, the flexible circuit part 31 may have multi-layer arrayed conductive layers, and for the flexible circuit part 31 according to the embodiment, a structure having first and second conductive layers 310 and 312 will be described as an embodiment.

According to an embodiment, the flexible circuit part 31 may include first and second conductive layers 310 and 312. According to an embodiment, the first conductive layer 310 may be disposed to be oriented in a first direction ① (e.g., upward direction), and the second conductive layer 312 may be disposed to be oriented in a second direction ② (e.g., downward direction) opposite to the first direction ①. For example, each of the first and second conductive layers 310 and 312 may include a conductive pattern.

According to an embodiment, the first and second conductive layers 310 and 312 may each include a cover layer to be protected from the outside and may include an insulating layer to be insulated from each other. According to an embodiment, the first conductive layer 310 may include a first protective layer 3101 disposed to be oriented in the first direction ① (e.g., upward direction) and a first insulating film 3102 (e.g., polyimide) disposed to be oriented in the second direction ② (e.g., downward direction). According to an embodiment, the first conductive layer 310 may be fabricated by providing a conductive pattern on one surface of the first insulating film 3102 oriented in the first direction ①. For example, a printing method may be used for the conductive pattern.

According to an embodiment, the second conductive layer 312 may include a second protective layer 3122 disposed to be oriented in the second direction ② (e.g., downward direction) and a second insulating film 3121 (e.g., polyimide) disposed to be oriented in the first direction ① (e.g., upward direction). According to an embodiment, the second conductive layer 312 may be fabricated by providing a conductive pattern on one surface of the second insulating film 3121 oriented in the second direction ②. For example, a printing method may be used for the conductive pattern.

According to an embodiment, an air layer 314 may be disposed between the first and second conductive layers 310 and 312. According to an embodiment, the air layer 314 is an air gap, and the flexible circuit part 31 may be spaced apart from the first and second insulating films 3102 and 3121 by the air layer 314. According to an embodiment, the air layer 314 may be directly connected to one end of the reinforcing member 40, may face the adhesive layer 400 of the reinforcing member 40, and may be disposed on the same layer as the reinforcing member 40. According to an embodiment, the air layer 314 may be disposed between the first and second insulating films 3102 and 3121. For example, the air layer 314 may function as an insulating layer or a cushion layer.

According to an embodiment, the first connection part 32 is an area bonded to the main circuit board 21 and may include a first layer 321 on which multiple first connection pads 3210 are disposed in the first direction ① and a second layer 322 which is oriented in the second direction ② on which multiple second connection pads 3220 are disposed. According to an embodiment, the multiple first connection pads 3210 may arranged on the first layer 321 to be spaced apart from each other, and the multiple second connection pads 3220 may be arranged on the second layer 322 to be spaced apart from each other.

According to an embodiment, each of the first connection pads 3210 may include a first connection hole 3211, and each of the second connection pads 3220 may include a second connection hole 3221. According to an embodiment, during a process of bonding the first connection part 32 to the main circuit board 21 (e.g., a hot bar process), molten lead is bonded to the connection pads 210 of the main circuit board 21 through the first and second connection holes 3211 and 3221 so that the flexible circuit part 31 can be electrically connected to the main circuit board 21. For example, reference numeral 34 indicates a conductive material such as lead, and may be a portion of a connection structure between the first connection part 32 and the main circuit board 21.

According to an embodiment, the first connection part 32 may include, in the first layer 321, a first insulating structure 3212 that insulates the first connection pads 3210 from each other and supports the first connection pads 3210 from each other. For example, the first connection pads 3210 and the first insulating structure 3212 may be fabricated through a photo solder resist (PSR) process. According to an embodiment, the first connection part 32 may include, in the second layer 322, a second insulating structure 3222 that insulates the second connection pads 3220 from each other and supports the second connection pads 3220 from each other. For example, the second connection pads 3220 and the second insulating structure 3222 may be fabricated through a photo solder resist (PSR) process.

According to an embodiment, a reinforcing member 40 configured to reinforce rigidity may be disposed in the first connection part 32 of the flexible circuit board 30. According to an embodiment, the reinforcing member 40 may be a reinforcing structure configure to suppress the boundary area between the flexible circuit part 31 and the first connection part 32 from being cracked or torn. According to an embodiment, the reinforcing member 40 may be disposed between the first and second layers 321 and 322 of the first connection part 32 and may include an overlapping portion 41 disposed to at least partially overlap the flexible circuit part 31 of the flexible circuit board 30 when viewed from above the flexible circuit board 30. For example, the reinforcing member 40 may be disposed between the first and second layers 321 and 322 by being bonded or compressed.

According to an embodiment, the reinforcing member 40 has a film shape and may include an adhesive layer 400 and first and second reinforcing insulating films 401 and 402 (e.g., polyimide). For example, the adhesive layer 400 may include a bonding sheet or prepreg (PPG).

According to an embodiment, the first reinforcing insulating film 401 is an insulating film bonded to the adhesive layer 400 and may be disposed to be oriented in the first direction ① (e.g., upward direction). According to an embodiment, the second reinforcing insulating film 402 is an insulating film bonded to the adhesive layer 400 and may be disposed to be oriented in the first direction ② (e.g., downward direction). According to an embodiment, the first and second reinforcing insulating films 401 and 402 may be integrated with each other by the adhesive layer 400. According to an embodiment, one end of the adhesive layer 400 and one end of each of the first and second reinforcing insulating films 401 and 402 may be disposed to overlap a portion of the flexible circuit board 30.

According to an embodiment, the first reinforcing insulating film 401 may extend from the first insulating film 3102 of the first conductive layer 310, and the second reinforcing insulating film 402 may extend from the second insulating film 3121 of the second conductive layer 312. According to an embodiment, the reinforcing member 40 may include multiple third connection holes 403 having the same structure as the first and second connection holes 3211 and 3221. For example, each of the first, second, and third connection holes 3211, 3221, and 403 may be coaxially disposed vertically.

Figure 8:
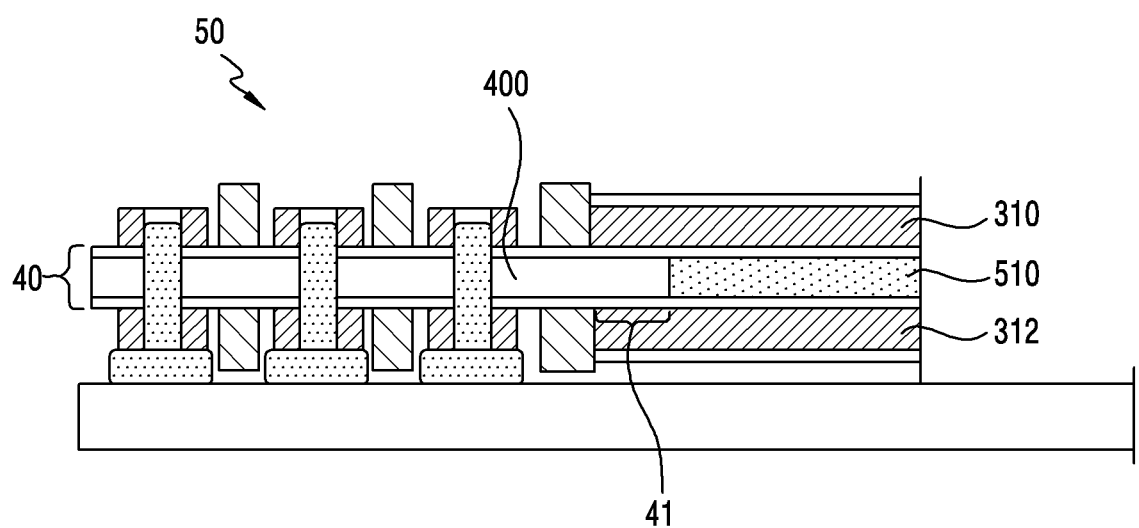
FIG. 8 is a cross-sectional view illustrating a connection structure of a connection part of a flexible circuit board including a reinforcing member according to an embodiment of the disclosure.

FIG. 8 is a cross-sectional view illustrating a connection structure of a connection part of a flexible circuit board including a reinforcing member according to an embodiment of the disclosure.

Referring to FIG. 8, the flexible circuit board 50 according to an embodiment is different from the flexible circuit board 30 illustrated in FIGS. 7A and 7B only in the structure between the first and second conductive layers 310 and 312, and the other structures are the same and thus will not be described in order to avoid redundant description.

According to an embodiment, in the flexible circuit board 50, an insulating layer 510 may be disposed between the first and second conductive layers 310 and 312. According to an embodiment, the insulating layer 510 may be directly connected to the overlapping portion 41 of the reinforcing member 40, may be disposed in the same layer as the reinforcing member 40, and may be in contact with the adhesive layer 400 of the overlapping portion 41. According to an embodiment, the insulating layer 510 may have a structure that integrally connects the first and second conductive layers 310 and 312.

Figure 9:
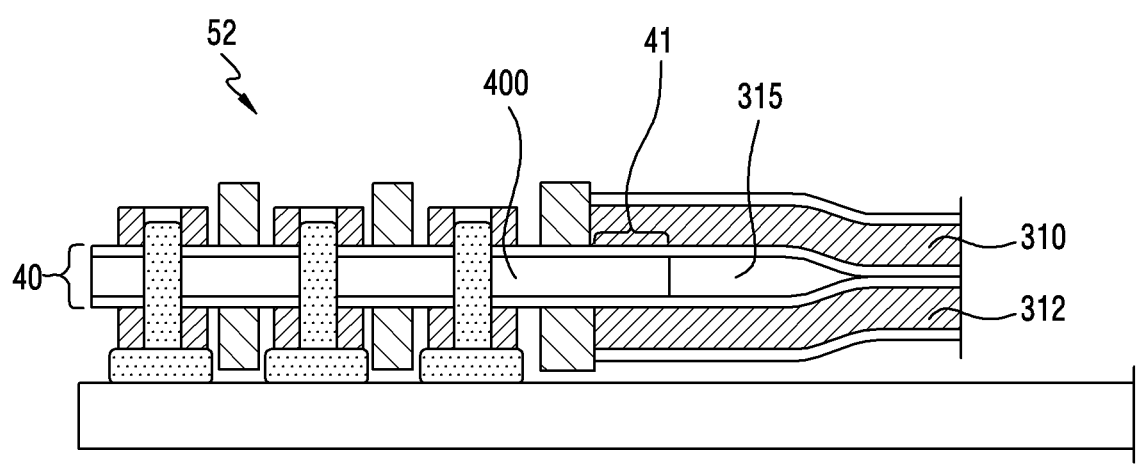
FIG. 9 is a cross-sectional view illustrating a connection structure of a connection part of a flexible circuit board including a reinforcing member according to an embodiment of the disclosure.

FIG. 9 is a cross-sectional view illustrating a connection structure of a connection part of a flexible circuit board including a reinforcing member according to an embodiment of the disclosure.

Referring to FIG. 9, the flexible circuit board 52 according to an embodiment is different from the flexible circuit board 30 illustrated in FIGS. 7A and 7B only in the structure between the first and second conductive layers 310 and 312, and the other structures are the same and thus will not be described in order to avoid redundant description.

According to an embodiment, the flexible circuit board 52 may be bonded between the first and second conductive layers 310 and 312. According to an embodiment, the space occupied by the air layer 315 between the first and second layers 321 and 322 may be limited due to the bonding structure of the first and second conductive layers 310 and 312. According to an embodiment, the overlapping portion 41 of the reinforcing member 40 may be directly connected to the air layer 315 between the first and second conductive layers 310 and 312, may be disposed on the same layer as the reinforcing member 40, and may be in contact with the adhesive layer 400 of the overlapping portion 41.

Figure 10:
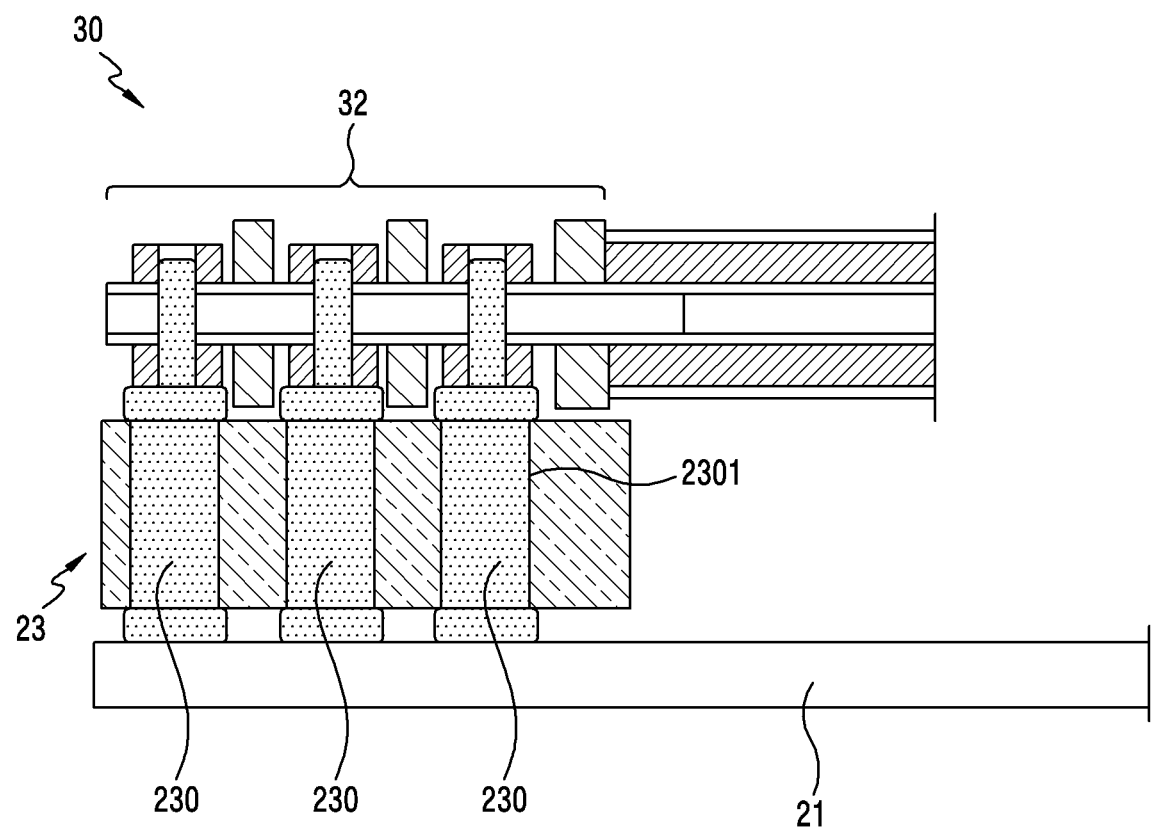
FIG. 10 is a cross-sectional view illustrating a connection structure of a connection part of a flexible circuit board using an interposer according to an embodiment of the disclosure.

FIG. 10 is a cross-sectional view illustrating a connection structure of a connection part of a flexible circuit board using an interposer according to an embodiment of the disclosure.

Referring to FIG. 10, the first connection part 32 of the flexible circuit board 30 according to an embodiment may be connected to the main circuit board 21 by using an interposer 23. According to an embodiment, the interposer 23 may be a conductive member that connects the first connection part 32 and the main circuit board 21. According to an embodiment, the interposer 23 may include multiple connection holes 2301. According to an embodiment, the connection holes 2301 may be disposed to be coaxial to the first to third connection holes 3211, 3221, and 403, respectively. During a bonding process between the first connection part 32 and the main circuit board 21 (e.g., a hot bar process), solder 230 may pass through the first to third connection holes 3211, 3221, and 403 and may then be connected to the connection holes 2301, thereby providing a signal transmission structure between the first connection part 32 and the main circuit board 21.

Various structures of the flexible circuit part 31 of the flexible circuit board 30 according to an embodiment will be described with reference to FIGS. 11A to 11C.

Figure 11A:
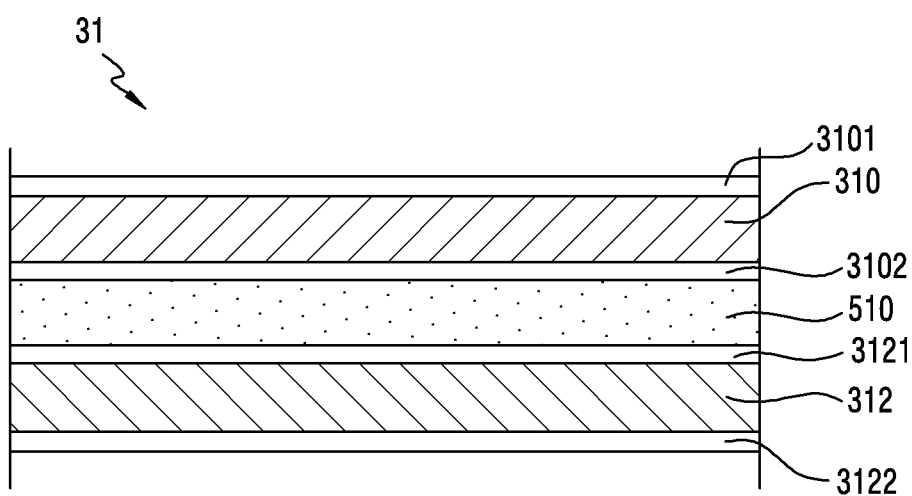
FIGS. 11A, 11B, and 11C are cross-sectional views respectively illustrating flexible circuit parts of flexible circuit boards according to various embodiments of the disclosure.
Figure 11B:
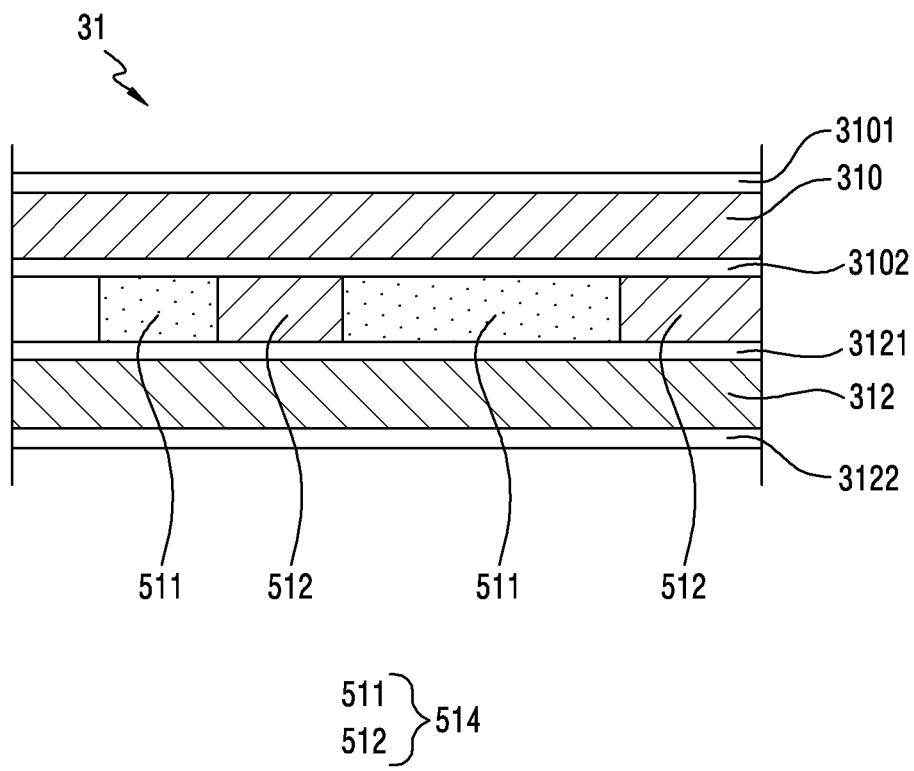
Figure 11C:
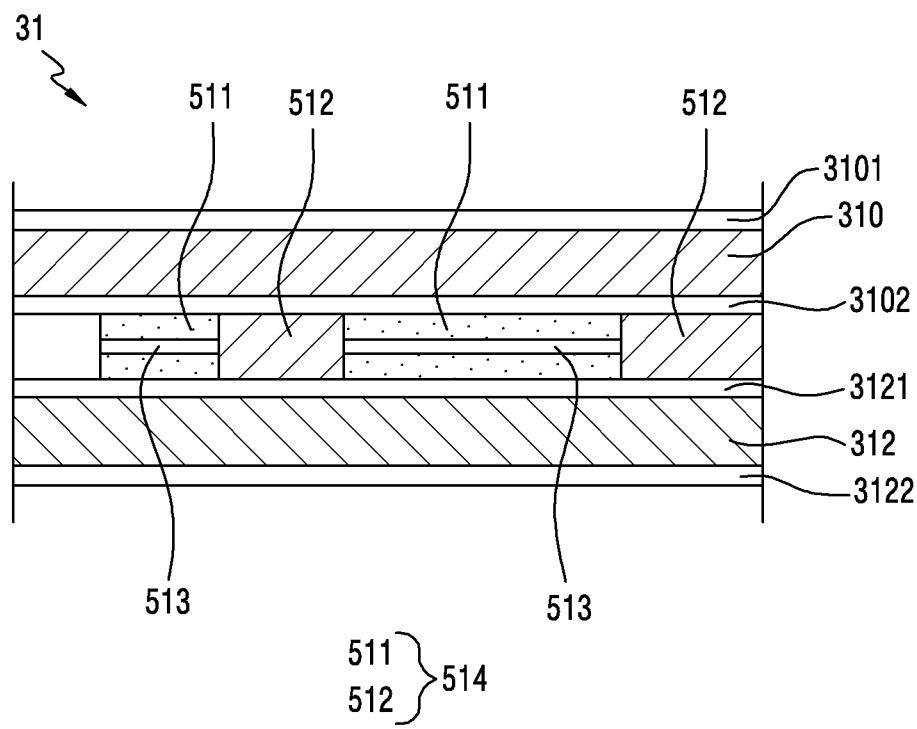

FIGS. 11A, 11B, and 11C are cross-sectional views respectively illustrating flexible circuit parts of flexible circuit boards according to various embodiments of the disclosure.

Referring to FIG. 11A, in the flexible circuit part 31 according to an embodiment, a flexible material portion 510 may be disposed between the first and second conductive layers 310 and 312. For example, the flexible material portion 510 may be an insulating material. According to an embodiment, the flexible material portion 510 may be disposed between the first and second insulating films 3102 and 3121 and may be disposed to completely fill the space between the first and second insulating films 3102 and 3121.

Referring to FIG. 11A, in the flexible circuit part 31 according to an embodiment, a rigid-flexible material portion 514 may be disposed between the first and second conductive layers 310 and 312. According to an embodiment, the rigid-flexible material portion 514 may be disposed between the first and second insulating films 3102 and 3121 and may be disposed to fill the space between the first and second insulating films 3102 and 3121.

According to an embodiment, in the rigid-flexible material portion 514, rigid material portions 512 and flexible material portions 511 may be alternately disposed along the longitudinal direction. According to an embodiment, the rigid-flexible material part 514 may minimize stress generated due to the bending, folding, or curved state of the flexible circuit part 31.

Referring to FIG. 11C, in the flexible circuit part 31 according to an embodiment, the rigid-flexible material portion 514 may be disposed between the first and second conductive layers 310 and 312. According to an embodiment, the rigid flexible material 514 may be disposed between the first and second insulating films 3102 and 3121 and may be disposed to fill the space between the first and second insulating films 3102 and 3121.

According to an embodiment, in the rigid-flexible material portion 514, rigid material portions 512 and flexible material portions 511 may be alternately disposed along the longitudinal direction. According to an embodiment, each of the soft material portions 511 may include at least one air layer 513. According to an embodiment, the rigid-flexible material part 514 may minimize stress generated due to the bending, folding, or curved state of the flexible circuit part 31.

Figure 12:
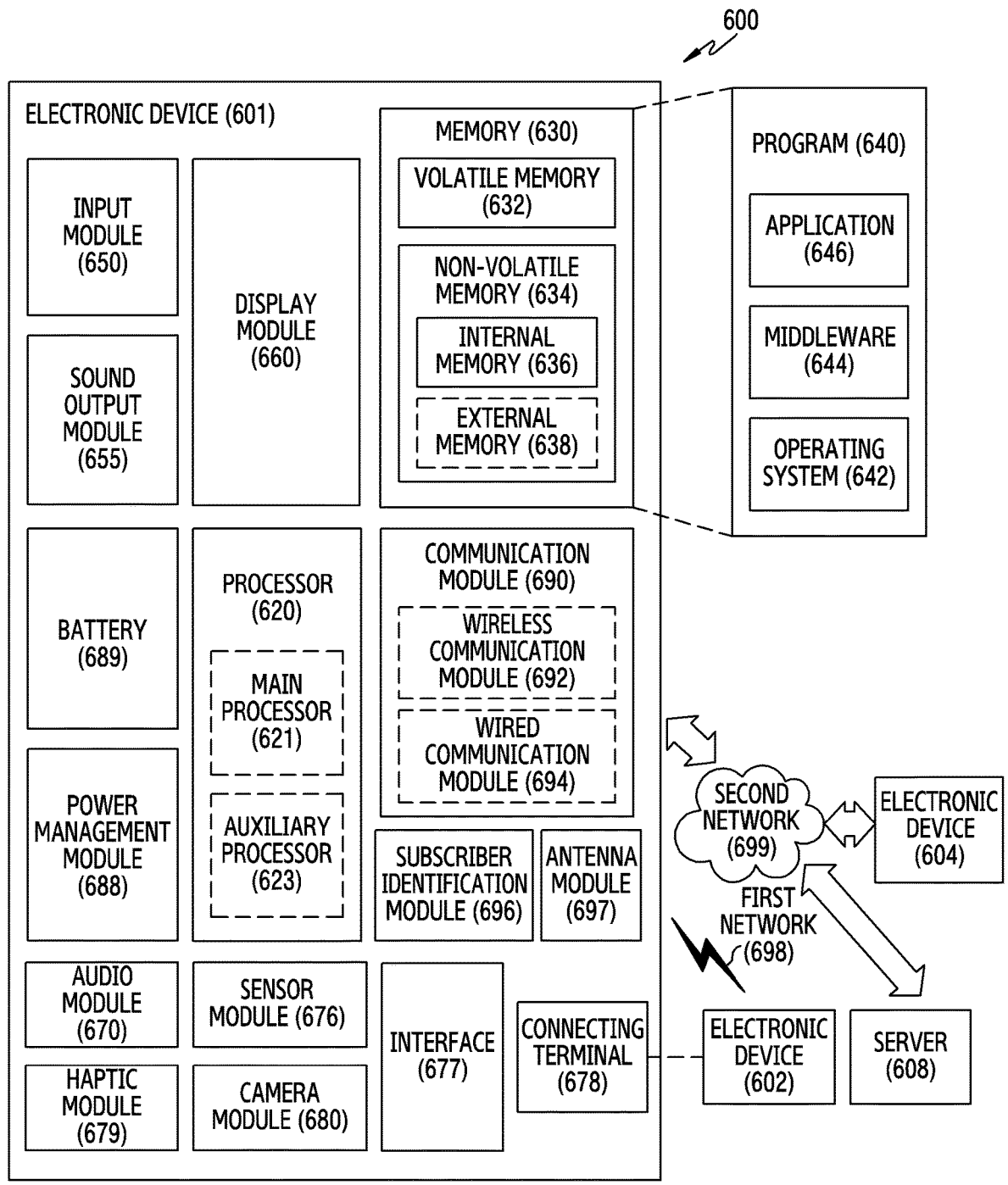
FIG. 12 is a block diagram of an electronic device 601 in a network environment 600 according to an embodiment of the disclosure.

FIG. 12 is a block diagram illustrating an electronic device 601 in a network environment 600 according to an embodiment of the disclosure.

Referring to FIG. 12, the electronic device 601 in the network environment 600 may communicate with an electronic device 602 via a first network 698 (e.g., a short-range wireless communication network), or at least one of an electronic device 604 or a server 608 via a second network 699 (e.g., a long-range wireless communication network). According to an embodiment, the electronic device 601 may communicate with the electronic device 604 via the server 608. According to an embodiment, the electronic device 601 may include a processor 620, memory 630, an input module 650, a sound output module 655, a display module 660, an audio module 670, a sensor module 676, an interface 677, a connecting terminal 678, a haptic module 679, a camera module 680, a power management module 688, a battery 689, a communication module 690, a subscriber identification module (SIM) 696, or an antenna module 697. In some embodiments, at least one of the components (e.g., the connecting terminal 678) may be omitted from the electronic device 601, or one or more other components may be added in the electronic device 601. In some embodiments, some of the components (e.g., the sensor module 676, the camera module 680, or the antenna module 697) may be implemented as a single component (e.g., the display module 660).

The processor 620 may execute, for example, software (e.g., a program 640) to control at least one other component (e.g., a hardware or software component) of the electronic device 601 coupled with the processor 620, and may perform various data processing or computation. According to one embodiment, as at least part of the data processing or computation, the processor 620 may store a command or data received from another component (e.g., the sensor module 676 or the communication module 690) in volatile memory 632, process the command or the data stored in the volatile memory 632, and store resulting data in non-volatile memory 634. According to an embodiment, the processor 620 may include a main processor 621 (e.g., a central processing unit (CPU) or an application processor (AP)), or an auxiliary processor 623 (e.g., a graphics processing unit (GPU), a neural processing unit (NPU), an image signal processor (ISP), a sensor hub processor, or a communication processor (CP)) that is operable independently from, or in conjunction with, the main processor 621. For example, when the electronic device 601 includes the main processor 621 and the auxiliary processor 623, the auxiliary processor 623 may be adapted to consume less power than the main processor 621, or to be specific to a specified function. The auxiliary processor 623 may be implemented as separate from, or as part of the main processor 621.

The auxiliary processor 623 may control at least some of functions or states related to at least one component (e.g., the display module 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). According to an embodiment, the auxiliary processor 623 (e.g., an image signal processor or a communication processor) may be implemented as part of another component (e.g., the camera module 680 or the communication module 690) functionally related to the auxiliary processor 623. According to an embodiment, the auxiliary processor 623 (e.g., the neural processing unit) may include a hardware structure specified for artificial intelligence model processing. An artificial intelligence model may be generated by machine learning. Such learning may be performed, e.g., by the electronic device 601 where the artificial intelligence is performed or via a separate server (e.g., the server 608). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory 634.

The program 640 may be stored in the memory 630 as software, and may include, for example, an operating system (OS) 642, middleware 644, or an application 646.

The input module 650 may receive a command or data to be used by another component (e.g., the processor 620) of the electronic device 601, from the outside (e.g., a user) of the electronic device 601. The input module 650 may include, for example, a microphone, a mouse, a keyboard, a key (e.g., a button), or a digital pen (e.g., a stylus pen).

The sound output module 655 may output sound signals to the outside of the electronic device 601. The sound output module 655 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 660 may visually provide information to the outside (e.g., a user) of the electronic device 601. The display module 660 may include, for example, a display, a hologram device, or a projector and control circuitry to control a corresponding one of the display, hologram device, and projector. According to an embodiment, the display module 660 may include a touch sensor adapted to detect a touch, or a pressure sensor adapted to measure the intensity of force incurred by the touch.

The audio module 670 may convert a sound into an electrical signal and vice versa. According to an embodiment, the audio module 670 may obtain the sound via the input module 650, or output the sound via the sound output module 655 or a headphone of an external electronic device (e.g., an electronic device 602) directly (e.g., wiredly) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. According to an embodiment, the sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device (e.g., the electronic device 602) directly (e.g., wiredly) or wirelessly. According to an embodiment, the interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device (e.g., the electronic device 602). According to an embodiment, the connecting terminal 678 may include, for example, a HDMI connector, a USB connector, an SD card connector, or an audio connector (e.g., a headphone connector).

The haptic module 679 may convert an electrical signal into a mechanical stimulus (e.g., a vibration or a movement) or electrical stimulus which may be recognized by a user via his tactile sensation or kinesthetic sensation. According to an embodiment, the haptic module 679 may include, for example, a motor, a piezoelectric element, or an electric stimulator.

The camera module 680 may capture a still image or moving images. According to an embodiment, the camera module 680 may include one or more lenses, image sensors, image signal processors, or flashes.

The power management module 688 may manage power supplied to the electronic device 601. According to one embodiment, the power management module 688 may be implemented as at least part of, for example, a power management integrated circuit (PMIC).

The battery 689 may supply power to at least one component of the electronic device 601. According to an embodiment, the battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the application processor (AP)) and supports a direct (e.g., wired) communication or a wireless communication. According to an embodiment, the communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or infrared data association (IrDA)) or the second network 699 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The wireless communication module 692 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 692 may support a high-frequency band (e.g., the millimeter wave (mmWave) band) to achieve, e.g., a high data transmission rate. The wireless communication module 692 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 692 may support various requirements specified in the electronic device 601, an external electronic device (e.g., the electronic device 604), or a network system (e.g., the second network 699). According to an embodiment, the wireless communication module 692 may support a peak data rate (e.g., 20 gigabits per second (Gbps) or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 697 may transmit or receive a signal or power to or from the outside (e.g., the external electronic device) of the electronic device 601. According to an embodiment, the antenna module 697 may include an antenna including a radiating element composed of a conductive material or a conductive pattern formed in or on a substrate (e.g., a printed circuit board (PCB)). According to an embodiment, the antenna module 697 may include a plurality of antennas (e.g., array antennas). In such a case, at least one antenna appropriate for a communication scheme used in the communication network, such as the first network 698 or the second network 699, may be selected, for example, by the communication module 690 (e.g., the wireless communication module 692) from the plurality of antennas. The signal or the power may then be transmitted or received between the communication module 690 and the external electronic device via the selected at least one antenna. According to an embodiment, another component (e.g., a radio frequency integrated circuit (RFIC)) other than the radiating element may be additionally formed as part of the antenna module 697.

According to various embodiments, the antenna module 697 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 601 and the external electronic device 604 via the server 608 coupled with the second network 699. Each of the electronic devices 602 or 604 may be a device of a same type as, or a different type, from the electronic device 601. According to an embodiment, all or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, mobile edge computing (MEC), or client-server computing technology may be used, for example. The electronic device 601 may provide ultra low-latency services using, e.g., distributed computing or mobile edge computing. In another embodiment, the external electronic device 604 may include an internet-of-things (IoT) device. The server 608 may be an intelligent server using machine learning and/or a neural network. According to an embodiment, the external electronic device 604 or the server 608 may be included in the second network 699. The electronic device 601 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 640) including one or more instructions that are stored in a storage medium (e.g., internal memory 636 or external memory 638) that is readable by a machine (e.g., the electronic device 601). For example, a processor (e.g., the processor 620) of the machine (e.g., the electronic device 601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, an electronic device (e.g., the wearable device 10 illustrated in FIG. 1) may include a housing (e.g., the housing 13 illustrated in FIG. 1), a main circuit board (e.g., the main circuit board 21 illustrated in FIG. 5) disposed within the housing (e.g., the housing 13 illustrated in FIG. 1), and at least one flexible circuit board (e.g., the flexible circuit board 30 illustrated in FIG. 6) electrically connected to the main circuit board (e.g., the main circuit board 21 illustrated in FIG. 5). The flexible circuit board (e.g., the flexible circuit board 30 illustrated in FIG. 6) may include a flexible circuit part (e.g., the flexible circuit part 31 illustrated in FIG. 6), and a connection part (e.g., the first connection part 32 illustrated in FIGS. 6 and 7A) disposed at one end of the flexible circuit part (e.g., the flexible circuit part 31 illustrated in FIG. 6) and connected to the main circuit board (e.g., the main circuit board 21 illustrated in FIG. 5). The connection part (e.g., the first connection part 32 illustrated in FIGS. 6 and 7A) may include a first layer (e.g., the first layer 321 illustrated in FIG. 7A) oriented in a first direction (e.g., the first direction ① illustrated in FIG. 7A) and including one or more first connection holes, a second layer (e.g., the second layer 322 illustrated in FIG. 7A) oriented in a second direction (e.g., the second direction ② illustrated in FIG. 7A) opposite to the first direction (e.g., the first direction ① illustrated in FIG. 7A) and including one or more second connection holes, and a reinforcing member (e.g., the reinforcing member 40 illustrated in FIG. 7A) disposed between the first and second layers (e.g., the first and second layers 321 and 322 illustrated in FIG. 7A) and connected to the flexible circuit part (e.g., the flexible circuit part 31 illustrated in FIG. 6) in a state of at least partially overlapping one end portion of the flexible circuit part (e.g., the flexible circuit part 31 illustrated in FIG. 6).

According to various embodiments, the reinforcing member (e.g., the reinforcing member 40 illustrated in FIG. 7A) may include first and second reinforcing insulating films (e.g., the first and second reinforcing insulating films 401 and 402 illustrated in FIG. 7A), and an adhesive layer (e.g., the adhesive layer 400 illustrated in FIG. 7A) bonded between the first and second reinforcing insulating films (e.g., the first and second reinforcing insulating films 401 and 402 illustrated in FIG. 7A).

According to various embodiments, the adhesive layer (e.g., the adhesive layer 400 illustrated in FIG. 7A) may include one end portion disposed to overlap the one end portion of the flexible circuit part (e.g., the flexible circuit part 31 illustrate in FIG. 6).

According to various embodiments, the flexible circuit part (e.g., the flexible circuit part 31 illustrated in FIG. 6) may include a first conductive layer disposed to be oriented in the first direction, and a second conductive layer disposed to be oriented in the second direction and spaced apart from the first conductive layer.

According to various embodiments, the first conductive layer may include a first protective layer (e.g., the first protective layer 3101 illustrated in FIG. 7A) applied to a first surface of the first conductive layer oriented in the first direction, and a first insulating film (e.g., the first insulating film 3102 illustrated in FIG. 7A) disposed on a second surface of the first conductive layer oriented in the second direction. The second conductive layer may include a second protective layer (e.g., the second protective layer 3122 illustrated in FIG. 7A) applied to a first surface of the second conductive layer oriented in the first direction, and a second insulating film (e.g., the second insulating film 3121 illustrated in FIG. 7A) disposed on a second surface of the second conductive layer oriented in the second direction.

According to various embodiments, an air layer (e.g., the air layer 314 illustrated in FIG. 7A) may be included between the first and second insulating films (e.g., the first and second insulating films 3102 and 3121 illustrated in FIG. 7A).

According to various embodiments, the adhesive layer (e.g., the adhesive layer 400 illustrated in FIG. 7A) may directly face the air layer (e.g., the air layer 314 illustrated in FIG. 7A).

According to various embodiments, a flexible material may be included between the first and second insulating films (e.g., the first and second insulating films 3102 and 3121 illustrated in FIG. 7A).

According to various embodiments, the reinforcing member (e.g., the reinforcing member 40 illustrated in FIG. 7A) may include one or more third connection holes, and each of the one or more third connection holes may be disposed to be vertically coaxial to a corresponding one of the one or more first connection holes and a corresponding one of the one or more second connection holes.

According to various embodiments, the first reinforcing insulating film (e.g., the first reinforcing insulating film 401 illustrated in FIG. 7A) may extend from the first insulating film (e.g., the first insulating film 3102 illustrated in FIG. 7A), and the second reinforcing insulating film (e.g., the second reinforcing insulating film 402 illustrated in FIG. 7A) may extend from the second insulating film (e.g., the second insulating film 3121 illustrated in FIG. 7A).

According to various embodiments, an interposer may be disposed between the connection part (e.g., the first connection part 32 illustrated in FIGS. 6 and 7A) and the main circuit board (e.g., the main circuit board 21 illustrated in FIG. 5).

According to various embodiments, the interposer may include one or more fourth connection holes, and each of the one or more fourth connection holes may be disposed to be vertically coaxial to a corresponding one of the one or more first connection holes and a corresponding one of the one or more second connection holes.

According to various embodiments, the flexible circuit board (e.g., the flexible circuit board 30 illustrated in FIG. 6) may include a flexible circuit portion (e.g., the flexible circuit part 31 illustrated in FIG. 6), and a connection part (e.g., the first connection part 32 illustrated in FIGS. 6 and 7A) disposed at one end of the flexible circuit part (e.g., flexible circuit part 31 illustrated in FIG. 6). The connection part (e.g., the first connection part 32 illustrated in FIGS. 6 and 7A) may include a first layer (e.g., the first layer 321 illustrated in FIG. 7A) oriented in a first direction (e.g., the first direction ① illustrated in FIG. 7A) and including one or more first connection holes, a second layer (e.g., the second layer 322 illustrated in FIG. 7A) oriented in a second direction (e.g., the second direction ② illustrated in FIG. 7A) opposite to the first direction and including one or more second connection holes, and a reinforcing member (e.g., the reinforcing member 40 illustrated in FIG. 7A) disposed between the first and second layers (e.g., the first and second layers 321 and 322 illustrated in FIG. 7A) and connected to the flexible circuit part (e.g., the flexible circuit part 31 illustrated in FIG. 6) in a state of at least partially overlapping one end portion of the flexible circuit part (e.g., the flexible circuit part 31 illustrated in FIG. 6).

According to various embodiments, the reinforcing member (e.g., the reinforcing member 40 illustrated in FIG. 7A) may include first and second reinforcing insulating films (e.g., the first and second reinforcing insulating films 401 and 402 illustrated in FIG. 7A), and an adhesive layer (e.g., the adhesive layer 400 illustrated in FIG. 7A) bonded between the first and second reinforcing insulating films (e.g., the first and second reinforcing insulating films 401 and 401 illustrated in FIG. 7A).

According to various embodiments, the flexible circuit part (e.g., the flexible circuit part 31 illustrated in FIG. 6) may include a first conductive layer disposed to be oriented in the first direction; and a second conductive layer disposed to be oriented in the second direction and spaced apart from the first conductive layer.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a main circuit board disposed within the housing; and
   at least one flexible circuit board electrically connected to the main circuit board,
   wherein the flexible circuit board comprises:
      a flexible circuit part, and
      a connection part disposed at one end of the flexible circuit part and connected to the main circuit board,
   wherein the connection part comprises:
      a first layer oriented in a first direction and including one or more first connection holes,
      a second layer oriented in a second direction opposite to the first direction and including one or more second connection holes, and
      a reinforcing member, disposed between the first and second layers, and connected to a layer of the flexible circuit part in a state of at least partially overlapping one end portion of the flexible circuit part, the layer of the flexible circuit part being disposed in a same layer as the reinforcing member, and
   wherein a material of the layer of the flexible circuit part is different from a material of the reinforcing member.

2. The electronic device of claim 1, wherein the reinforcing member comprises:
   first and second reinforcing insulating films, and
   an adhesive layer bonded between the first and second reinforcing insulating films.

3. The electronic device of claim 2, wherein the adhesive layer comprises one end portion disposed to overlap the one end portion of the flexible circuit part.

4. The electronic device of claim 2, wherein the flexible circuit part comprises:
   a first conductive layer disposed to be oriented in the first direction, and
   a second conductive layer disposed to be oriented in the second direction and spaced apart from the first conductive layer.

5. The electronic device of claim 4,
   wherein the first conductive layer comprises:
      a first protective layer applied to a first surface of the first conductive layer oriented in the first direction, and
      a first insulating film disposed on a second surface of the first conductive layer oriented in the second direction, and
   wherein the second conductive layer comprises:
      a second protective layer applied to a first surface of the second conductive layer oriented in the first direction, and
      a second insulating film disposed on a second surface of the second conductive layer oriented in the second direction.

6. The electronic device of claim 5, further comprising: an air layer between the first and second insulating films.

7. The electronic device of claim 6, wherein the adhesive layer directly faces the air layer.

8. The electronic device of claim 5, further comprising: a flexible material between the first and second insulating films.

9. The electronic device of claim 5,
wherein the first reinforcing insulating film extends from the first insulating film, and
wherein the second reinforcing insulating film extends from the second insulating film.

10. The electronic device of claim 1,
wherein the reinforcing member comprises one or more third connection holes, and
wherein each of the one or more third connection holes are disposed to be vertically coaxial to a corresponding one of the one or more first connection holes and a corresponding one of the one or more second connection holes.

11. The electronic device of claim 1, wherein an interposer is disposed between the connection part and the main circuit board.

12. The electronic device of claim 11,
wherein the interposer comprises one or more fourth connection holes, and
wherein each of the one or more fourth connection holes are disposed to be vertically coaxial to a corresponding one of the one or more first connection holes and a corresponding one of the one or more second connection holes.

13. The electronic device of claim 1, wherein each of the one or more first connection holes are disposed to be vertically coaxial to a corresponding one of the one or more second connection holes.

14. A flexible circuit board comprising:
a flexible circuit part; and
a connection part disposed at one end of the flexible circuit part,
wherein the connection part comprises:
 a first layer oriented in a first direction and including one or more first connection holes,
 a second layer oriented in a second direction opposite to the first direction and including one or more second connection holes, and
 a reinforcing member, disposed between the first and second layers, connected to a layer of the flexible circuit part in a state of at least partially overlapping one end portion of the flexible circuit part, the layer of the flexible circuit part being disposed in a same layer as the reinforcing member, and
wherein a material of the layer of the flexible circuit part is different from a material of the reinforcing member.

15. The flexible circuit board of claim 14, wherein the reinforcing member comprises:
first and second reinforcing insulating films, and
an adhesive layer bonded between the first and second reinforcing insulating films.

16. The flexible circuit board of claim 15, wherein the adhesive layer comprises one end portion disposed to overlap the one end portion of the flexible circuit part.

17. The flexible circuit board of claim 15, wherein the flexible circuit part comprises:
a first conductive layer disposed to be oriented in the first direction, and
a second conductive layer disposed to be oriented in the second direction opposite and spaced apart from the first conductive layer.

18. The flexible circuit board of claim 17,
wherein the first conductive layer comprises:
 a first protective layer applied to a first surface of the first conductive layer oriented in the first direction, and
 a first insulating film disposed on a second surface of the first conductive layer oriented in the second direction, and
wherein the second conductive layer comprises:
 a second protective layer applied to a first surface of the second conductive layer oriented in the first direction, and
 a second insulating film disposed on a second surface of the second conductive layer oriented in the second direction.

19. The flexible circuit board of claim 18, further comprising: an air layer between the first and second insulating films.

20. The flexible circuit board of claim 19, wherein the adhesive layer directly faces the air layer.

* * * * *